(12) United States Patent
Lee et al.

(10) Patent No.: US 10,739,830 B2
(45) Date of Patent: Aug. 11, 2020

(54) ELECTRONIC DEVICE INCLUDING VAPOR (TWO PHASE) CHAMBER FOR ABSORBING HEAT

(71) Applicant: SAMSUNG ELECTRONICS CO., LTD., Suwon-si, Gyeonggi-do (KR)

(72) Inventors: Hae Jin Lee, Seoul (KR); Kyung Ha Koo, Seoul (KR); Jung Je Bang, Suwon-si (KR); Chi Hyun Cho, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/820,791

(22) Filed: Nov. 22, 2017

(65) Prior Publication Data
US 2018/0143671 A1    May 24, 2018

(30) Foreign Application Priority Data

Nov. 23, 2016 (KR) .......................... 10-2016-0156143

(51) Int. Cl.
*G06F 1/20* (2006.01)
*H05K 7/20* (2006.01)
(Continued)

(52) U.S. Cl.
CPC ............ *G06F 1/20* (2013.01); *G11B 33/1406* (2013.01); *H01L 23/427* (2013.01);
(Continued)

(58) Field of Classification Search
CPC ... H01L 23/427; G06F 1/20; G06F 2200/201; H05K 7/20336; H05K 1/0272; H05K 9/0032; G11B 33/1406
See application file for complete search history.

(56) References Cited

U.S. PATENT DOCUMENTS 5,880,524 A     3/1999  Xie
6,082,443 A *   7/2000  Yamamoto .......... F28D 15/0233
                                                165/104.21
(Continued)

FOREIGN PATENT DOCUMENTS

CN          2824518 Y    10/2006
CN        203896662 U    10/2014
(Continued)

OTHER PUBLICATIONS

Search Report and Written Opinion dated Mar. 8, 2018 in counterpart International Patent Application No. PCT/KR2017/013096.
(Continued)

*Primary Examiner* — James Wu
(74) *Attorney, Agent, or Firm* — Nixon & Vanderhye P.C.

(57) ABSTRACT

An electronic device according to an embodiment of the present disclosure includes a printed circuit board (PCB), a first component disposed in a first region on the PCB and a second component disposed in a second region on the PCB, and a chamber disposed on the first and second components and having a region including the first and second regions, in which fluid absorbing heat radiating from the first and second components is included in the chamber.

16 Claims, 12 Drawing Sheets

(51) Int. Cl.
  *H05K 9/00* (2006.01)
  *H01L 23/427* (2006.01)
  *G11B 33/14* (2006.01)

(52) U.S. Cl.
  CPC ....... *H05K 7/20336* (2013.01); *H05K 9/0032* (2013.01); *H01L 2224/73204* (2013.01); *H01L 2224/92125* (2013.01); *H01L 2924/19105* (2013.01)

(56) References Cited

U.S. PATENT DOCUMENTS

| | | | |
|---|---|---|---|
| 6,901,994 B1* | 6/2005 | Jin-Cherng | ........... F28D 15/046 165/104.26 |
| 7,913,748 B2 | 3/2011 | Lin et al. | |
| 8,857,502 B2 | 10/2014 | Huang | |
| 8,879,259 B2 | 11/2014 | Suzuki et al. | |
| 8,970,029 B2 | 3/2015 | Lin et al. | |
| 9,320,171 B2 | 4/2016 | Joshi et al. | |
| 9,241,423 B2 | 6/2016 | Chiu | |
| 10,103,087 B2 | 10/2018 | Jin et al. | |
| 2006/0139883 A1 | 6/2006 | Hu et al. | |
| 2006/0196640 A1 | 9/2006 | Siu | |
| 2008/0029249 A1* | 2/2008 | Hsiao | ................... F28D 15/046 165/104.26 |
| 2009/0161300 A1* | 6/2009 | Chou | ................. H05K 7/20363 361/619 |
| 2009/0294104 A1 | 12/2009 | Lin et al. | |
| 2010/0018678 A1 | 1/2010 | Siu | |
| 2011/0024892 A1* | 2/2011 | Lin | ......................... H01L 23/04 257/690 |
| 2011/0083835 A1* | 4/2011 | Chen | .................... F28D 15/046 165/185 |
| 2012/0050993 A1 | 3/2012 | Suzuki et al. | |
| 2013/0025829 A1 | 1/2013 | Huang | |
| 2014/0307388 A1 | 10/2014 | Chiu | |
| 2015/0359133 A1 | 12/2015 | Joshi et al. | |
| 2016/0109911 A1 | 4/2016 | Han | |

FOREIGN PATENT DOCUMENTS

| | | |
|---|---|---|
| CN | 104813760 A | 7/2015 |
| CN | 104902727 A | 9/2015 |
| CN | 205039873 U | 2/2016 |
| CN | 105472950 A | 4/2016 |
| CN | 105873417 A | 8/2016 |
| CN | 105916351 A | 8/2016 |
| KR | 10-2017-0097541 | 8/2017 |
| TW | 201317532 * | 5/2013 |

OTHER PUBLICATIONS

Search Report dated May 3, 2018 in counterpart European Patent Application No. 17202581.9.
Chinese Office Action dated Apr. 10, 2020 for CN Application No. 201711180665.5.

* cited by examiner

ELECTRONIC DEVICE INCLUDING VAPOR (TWO PHASE) CHAMBER FOR ABSORBING HEAT

CROSS-REFERENCE TO RELATED APPLICATION

This application is based on and claims priority under 35 U.S.C. § 119 to a Korean patent application filed on Nov. 23, 2016 in the Korean Intellectual Property Office and assigned Serial number 10-2016-0156143, the disclosure of which is incorporated by reference herein in its entirety.

TECHNICAL FIELD

The present disclosure relates generally to a technology for absorbing heat radiated from a component.

BACKGROUND

Electronic devices, such as smartphones and wearable devices, have been widely used with the development of mobile communication technologies. These electronic devices may include various components to provide a variety of functions. For example, an electronic device may include a graphic processing unit (GPU) to provide a graphical user interface (GUI) through a display module. In addition, the electronic device may include a communication processor to communicate with other electronic devices.

However, the aforementioned components may generate electromagnetic waves, and the electromagnetic waves generated by the components may cause a malfunction of the electronic device. Furthermore, the electromagnetic waves generated by the components may have a harmful influence on a human body. Accordingly, a shield-can needs to be disposed on the components to shield the electromagnetic waves. The shield-can may shield the electromagnetic waves generated by the components.

The components may generate heat, as well as electromagnetic waves. The heat generated by the components may be transferred to a surface of the product to cause a user to feel uncomfortable and degrade the performance of the product, and heat transferred to a PCB may cause a malfunction of other components. Accordingly, it is necessary to prevent and/or reduce the heat generated by the components from being transferred to a surface of the product and neighboring components. However, since the aforementioned shield-can has a low thermal heat capacity, the heat generated by the components may be transferred to a surface of the product and the neighboring components. For example, heat radiating from a processor is not discharged through the shield-can and thus may affect a memory through the PCB.

SUMMARY

Example aspects of the present disclosure address at least the above-mentioned problems and/or disadvantages and provide at least the advantages described below. Accordingly, an example aspect of the present disclosure provides an electronic device addressing the above-mentioned problems and disadvantages.

In accordance with an example aspect of the present disclosure, an electronic device includes a printed circuit board (PCB), a first component disposed in a first region on the PCB, a second component disposed in a second region on the PCB, and a chamber disposed on the first and second components, and having a region corresponding to the first and second regions. A fluid absorbing heat radiated from the first and second components may be included in the chamber.

In accordance with another example aspect of the present disclosure, an electronic device includes a printed circuit board (PCB), a first component and a second component disposed on the PCB, a frame disposed on the PCB and surrounding the first and second components, and a chamber that includes a first member contacting the frame and a second member coupled with the first member. The chamber may include an internal space, and a powder disposed in the internal space serving as a passage through which fluid absorbing heat radiated from the first and second components flows.

According to various example embodiments of the present disclosure, a vapor (two phase) chamber for absorbing heat radiating from a component may be disposed in an electronic device to lower the temperature of the component, thereby preventing and/or reducing degradation in the performance of the component and simultaneously lowering the temperature of the product.

Furthermore, according to various example embodiments of the present disclosure, by using a vapor chamber having a metal surface, it is possible to shield electromagnetic wave noises generated by a component.

In addition, the present disclosure may provide various effects that are directly or indirectly recognized.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and attendant advantages of the present disclosure will be more apparent and readily appreciated from the following detailed description, taken in conjunction with the accompanying drawings, in which like reference numerals refer to like elements, and wherein.

Throughout the drawings, it should be noted that like reference numbers are used to depict the same or similar elements, features, and structures.

DETAILED DESCRIPTION

Figure 1A:
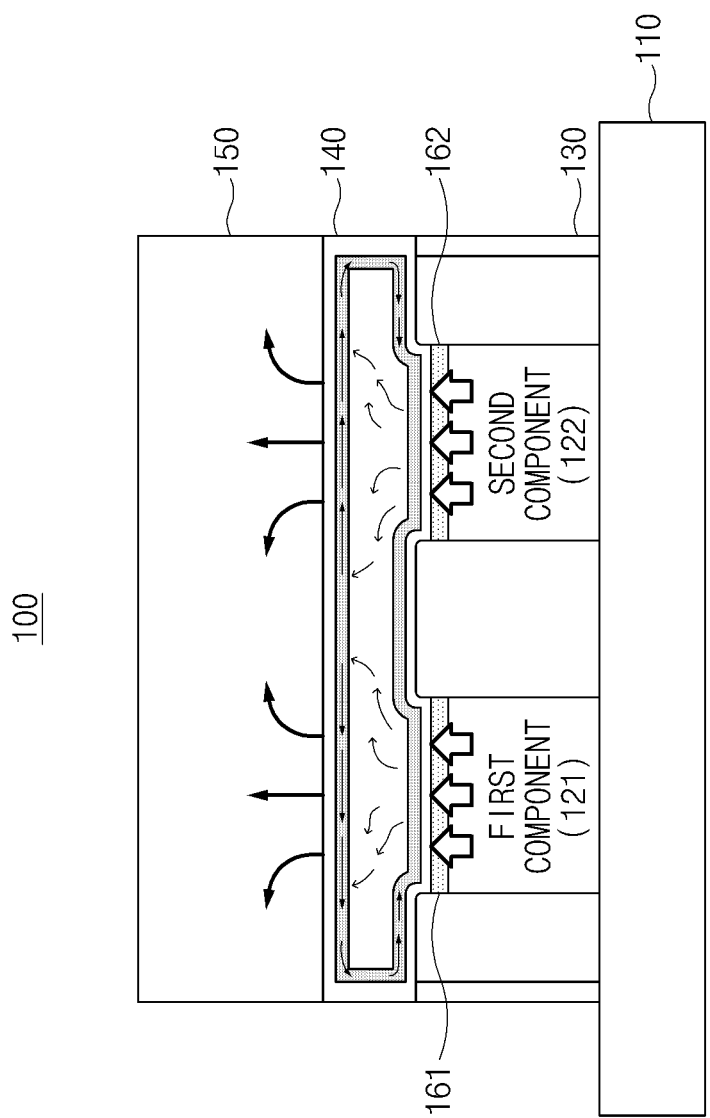
FIG. 1A is a sectional view illustrating an example chamber, according to an example embodiment.

Hereinafter, various example embodiments of the present disclosure may be described with reference to accompanying drawings. Accordingly, those of ordinary skill in the art will recognize that modifications, equivalents, and/or alternatives of the various example embodiments described herein can be variously made without departing from the scope and spirit of the present disclosure. With regard to description of drawings, similar elements may be marked by similar reference numerals.

In this disclosure, the expressions "have", "may have", "include" and "comprise", or "may include" and "may comprise" used herein indicate existence of corresponding features (e.g., elements such as numeric values, functions, operations, or components) but do not exclude presence of additional features.

In this disclosure, the expressions "A or B", "at least one of A or/and B", or "one or more of A or/and B", and the like may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used in this disclosure may be used to refer to various elements regardless of the order and/or the priority and to distinguish the relevant elements from other elements, but do not limit the elements. For example, "a first user device" and "a second user device" indicate different user devices regardless of the order or priority. For example, without departing the scope of the present disclosure, a first element may be referred to as a second element, and similarly, a second element may be referred to as a first element.

It will be understood that when an element (e.g., a first element) is referred to as being "(operatively or communicatively) coupled with/to" or "connected to" another element (e.g., a second element), it may be directly coupled with/to or connected to the other element or an intervening element (e.g., a third element) may be present. On the other hand, when an element (e.g., a first element) is referred to as being "directly coupled with/to" or "directly connected to" another element (e.g., a second element), it should be understood that there is no intervening element (e.g., a third element).

According to the situation, the expression "configured to" used in this disclosure may be used interchangeably with, for example, the expression "suitable for", "having the capacity to", "designed to", "adapted to", "made to", or "capable of". The term "configured to" must not refer only to "specifically designed to" in hardware. Instead, the expression "a device configured to" may refer to a situation in which the device is "capable of" operating together with another device or other components. For example, a "processor configured to (or set to) perform A, B, and C" may refer, for example, and without limitation, to a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

Terms used in this disclosure are used to describe specified embodiments and are not intended to limit the scope of another embodiment. The terms of a singular form may include plural forms unless otherwise specified. All the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal unless expressly so defined in various example embodiments of this disclosure. In some cases, even if terms are terms which are defined in this disclosure, they may not be interpreted to exclude embodiments of this disclosure.

An electronic device according to various embodiments of this disclosure may include at least one of, for example, smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices, or the like, but is not limited thereto. According to various embodiments, the wearable device may include at least one of an accessory type (e.g., watches, rings, bracelets, anklets, necklaces, glasses, contact lens, or head-mounted-devices (HMDs), a fabric or garment-integrated type (e.g., an electronic apparel), a body-attached type (e.g., a skin pad or tattoos), or a bio-implantable type (e.g., an implantable circuit), or the like, but is not limited thereto.

According to various embodiments, the electronic device may be a home appliance. The home appliances may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ or PlayStation™), electronic dictionaries, electronic keys, camcorders, electronic picture frames, or the like, but is not limited thereto.

According to another embodiment, an electronic device may include at least one of various medical devices (e.g., various portable medical measurement devices (e.g., a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation devices, Global Navigation Satellite System (GNSS), event data recorders (EDRs), flight data recorders (FDRs), vehicle infotainment devices, electronic equipment for vessels (e.g., navigation systems and gyrocompasses), avionics, security devices, head units for vehicles, industrial or home robots, automatic teller's machines (ATMs), points of sales (POSs) of stores, or internet of things (e.g., light bulbs, various sensors, electric or gas meters, sprinkler devices, fire alarms, thermostats, street lamps, toasters, exercise equipment, hot water tanks, heaters, boilers, and the like), or the like, but is not limited thereto.

According to an embodiment, the electronic device may include at least one of parts of furniture or buildings/structures, electronic boards, electronic signature receiving devices, projectors, or various measuring instruments (e.g., water meters, electricity meters, gas meters, or wave meters, and the like), or the like, but is not limited thereto. According to various embodiments, the electronic device may be one of the above-described devices or a combination thereof. An electronic device according to an embodiment may be a flexible electronic device. Furthermore, an electronic device according to an embodiment of this disclosure may not be limited to the above-described electronic devices and may include other electronic devices and new electronic devices according to the development of technologies.

Hereinafter, electronic devices according to various embodiments will be described in greater detail with reference to the accompanying drawings. In this disclosure, the term "user" may refer to a person who uses an electronic device or may refer to a device (e.g., an artificial intelligence electronic device) that uses the electronic device.

Figure 1B:
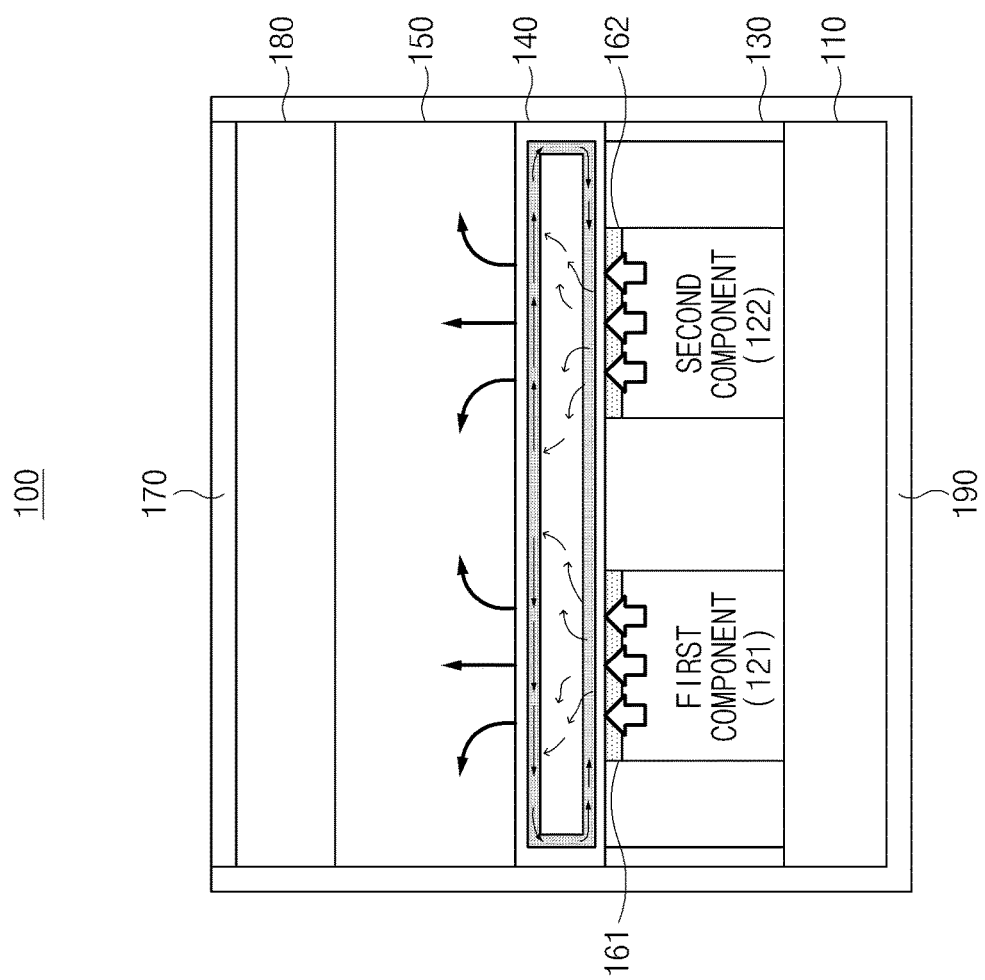
FIG. 1B is a sectional view illustrating an example electronic device, according to an example embodiment.

FIG. 1A is a sectional view illustrating an example chamber, according to an example embodiment. FIG. 1B is a sectional view illustrating an example electronic device, according to an example embodiment.

Referring to FIG. 1A, an electronic device 100 may include a printed circuit board (PCB) 110, a first component 121, a second component 122, a frame 130, a chamber 140, a bracket 150, and thermal interface materials (TIMs) 161 and 162.

Various types of electronic components, elements, and circuits of the electronic device 100 may be mounted on the PCB 110. For example, and without limitation, a power management integrated circuit (PMIC), an application processor (AP), a memory, a communication processor (CP), and the like may be mounted on the PCB 110. The PCB 110 may be referred to as a main board or a printed board assembly (PBA).

The first component 121 and the second component 122 may be mounted on the PCB 110. For example, the first component 121 may be disposed in a first region on the PCB 110, and the second component 122 may be disposed in a second region on the PCB 110. The first region and the second region may be certain regions on the PCB 110. The sizes of the first and second regions may, for example, be proportional to the sizes of the first and second components 121 and 122, respectively. The first component 121 and the second component 122 may radiate heat during an operation. For example, the first component 121 and the second component 122 may be any one of a PMIC, an AP, a memory, and a CP that radiate heat during an operation.

The frame 130 may be disposed on the PCB 110 and may surround the first component 121 and the second component 122. An internal region formed by the frame 130 on the PCB 110 may include the first region and the second region. While FIG. 1 illustrates that the first component 121 and the second component 122 are mounted on the PCB 110, three or more components may be mounted on the PCB 110. In the case where three or more components are mounted on the PCB 110, the frame 130 may be disposed on the PCB 110 to surround all the components.

The chamber 140 may be disposed on the frame 130. While the frame 130 and the chamber 140 are illustrated as different elements in FIG. 1A, the frame 130 may be part of the chamber 140. Alternatively, the chamber 140 may be disposed on the first and second components 121 and 122 and coupled with the bracket 150 without the frame 130. The frame 130 and the chamber 140 may be formed of the same material or different materials.

The bracket 150 may, for example, and without limitation, comprise a plastic injection-molded material or metal and may be disposed on the chamber 140. Although not illustrated in FIG. 1A, the bracket 150 may be coupled with a display and the chamber 140 to physically support the display and the chamber 140. According to an embodiment, a swelling gap may be formed in the bracket 150 in consideration of swelling of the chamber 140.

The thermal interface material (TIM) 161 may be disposed between the first component 121 and the chamber 140 to transfer heat radiating from the first component 121 to the chamber 140. The thermal interface material 161 may be used to stick (e.g, attach, adhere, or the like) the first component 121 and the chamber 140. The thermal interface materials 161 and 162 may be any one of, for example, and without limitation, grease, elastomer including thermally conductive filler, and an adhesive film, or the like. FIG. 1A illustrates that the thermal interface materials 161 and 162 are disposed between the first component 121 and the chamber 140 and between the second component 122 and the chamber 140, respectively. However, the thermal interface materials 161 and 162 may not be disposed between the first component 121 and the chamber 140 and between the second component 122 and the chamber 140. In the case where there are no thermal interface materials 161 and 162, heat radiating from the first and second components 121 and 122 may be directly transferred to the chamber 140.

According to an example embodiment of the present disclosure, the thermal interface material 161 may be disposed between the chamber 140 and the bracket 150. The thermal interface material 161, which is disposed between the chamber 140 and the bracket 150, may transfer heat absorbed by the chamber 140 to the bracket 150. The bracket 150 may, for example, comprise a metal capable of absorbing heat from the thermal interface material 161. The bracket 150 may discharge heat absorbed from the thermal interface material 161 outside the electronic device 100.

Referring to FIG. 1B, the electronic device 100 may include a cover glass 170, a display 180, and a housing 190. The cover glass 170 may transmit light generated by the display 180. Furthermore, a user may perform a touch (including contact using an electronic pen) by touching the cover glass 170 with a part of his/her body (e.g., a finger). The cover glass 170 may comprise, for example, reinforced glass, reinforced plastic, a flexible polymer material, or the like to protect the display 180 and the elements included in the electronic device 100 from an external shock. According to an embodiment, the cover glass 170 may be referred to as a glass window.

The display 180 may be disposed below the cover glass 170 and above the bracket 150. Furthermore, the display 180 may be electrically connected with the PCB 110 to output contents (e.g., text, an image, a video, an icon, a widget, a symbol, or the like) or receive a touch input (e.g., a touch, a gesture, hovering, or the like) from the user.

The housing 190 may form the exterior of the electronic device 100. The housing 190 may include a region not exposed outside the electronic device 100 and a lateral region exposed outside the electronic device 100. For example, the region not exposed outside the electronic device 100 may, for example, comprise a plastic injection-molded material, and the lateral region exposed outside the electronic device 100 may comprise a metal. The metal exposed lateral region may be referred to as a metal bezel. According to an embodiment, at least part of the metal bezel may be utilized as an antenna radiator for transmitting and receiving a signal of a specified frequency.

Referring again to FIG. 1B, the chamber 140 illustrated in FIG. 1B may have flat portions coupled with the first and second components 121 and 122, as opposed to the chamber 140 illustrated in FIG. 1A. The chamber 140 having the flat portions coupled with the first and second components 121 and 122 may be easier to manufacture than the chamber 140 having uneven portions with which the first and second components 121 and 122 are coupled.

Figure 2A:
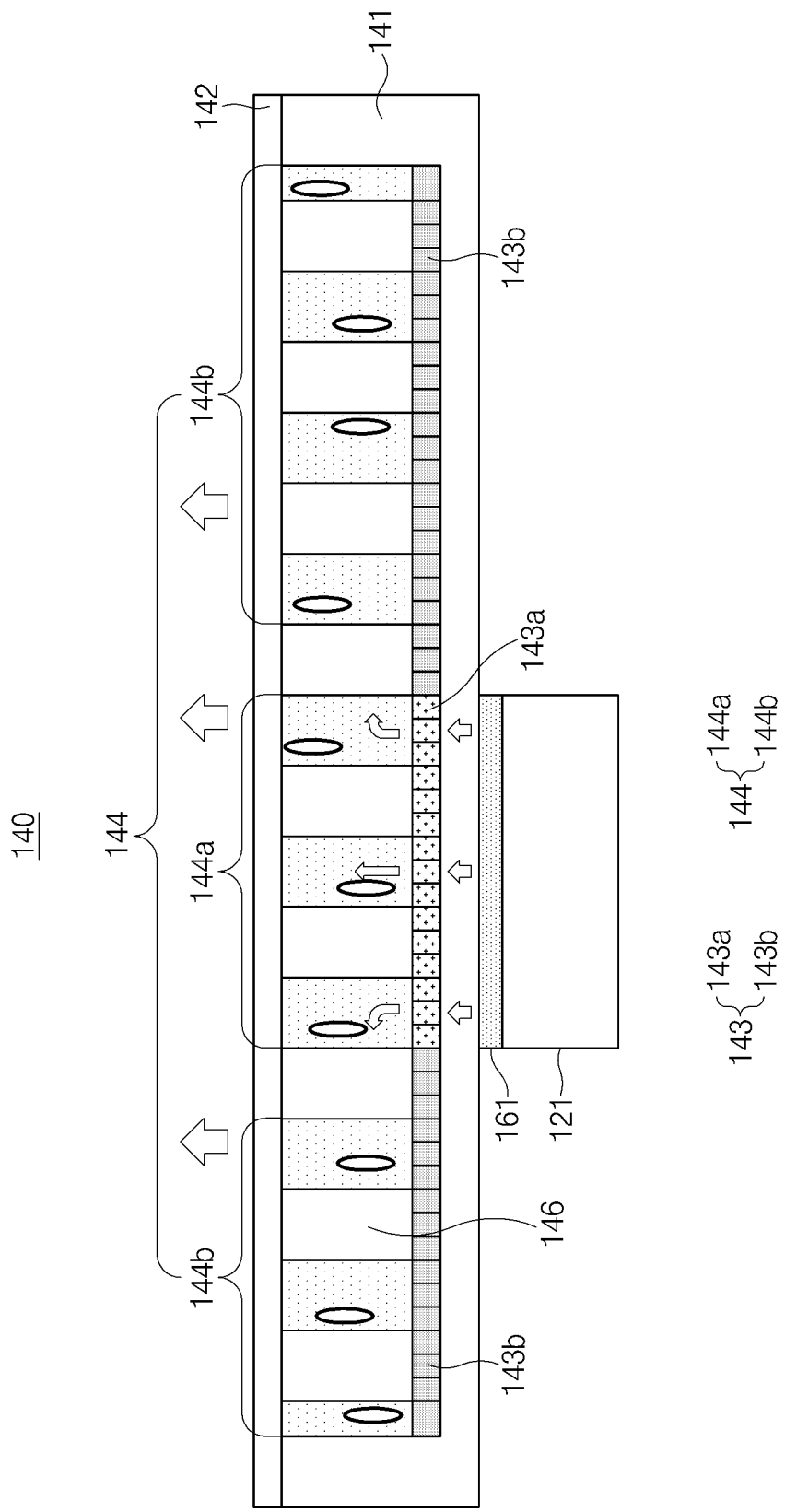
FIG. 2A is a sectional view illustrating an example chamber having column-shaped powder disposed therein, according to an example embodiment.
Figure 2B:
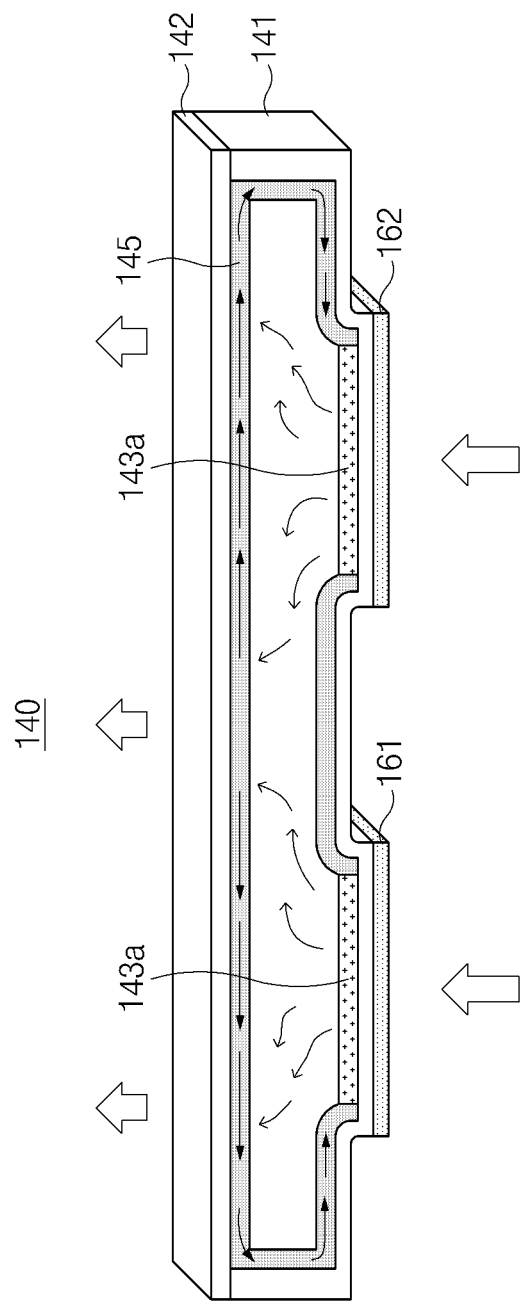
FIG. 2B is a sectional view illustrating an example chamber having powder or a mesh disposed on a surface of first and second members, according to an example embodiment.

FIG. 2A is a sectional view illustrating an example chamber 140 having column-shaped powder disposed therein, according to an example embodiment. FIG. 2B is a sectional view illustrating the example chamber 140 having powder or a mesh disposed on a surface of first and second members 141 and 142, according to an example embodiment.

Referring to FIGS. 2A and 2B, the chamber 140 may include the first member 141 and the second member 142. The first member 141 may be a plate that forms a lower part of the chamber 140, and the second member 142 may be a plate that forms an upper part of the chamber 140. For example, the first member 141 may make contact with the frame 130 disposed below the chamber 140, and the second member 142 may make contact with the bracket 150 disposed above the chamber 140. The first member 141 and the second member 142 may be formed of the same material and may include, for example, and without limitation, a highly-conductive metal. For example, and without limitation, the first member 141 and the second member 142 may include at least one of copper (Cu) and graphite.

The second member 142 may be coupled with the first member 141 to form space 146 inside the chamber 140. Powder 143, 144, and 145, which serves as a passage through which fluid flows, may be arranged in the internal space formed by the first member 141 and the second member 142. The fluid may be a material (e.g., distilled water) that absorbs heat radiating from the first and second components 121 and 122 and consumes the absorbed energy when being changed from a liquid state to a gaseous state. The gaseous fluid may change into a liquid state again by discharging heat outside the electronic device 100. The powder may comprise metal particles (e.g., copper particles), and the fluid may flow between the metal particles.

Referring to FIG. 2A, the powder 143 and 144 may include the powder 143 disposed on a surface of the first member 141 and the powder 144 having a column shape. The fluid may move to the left and right through the powder 143 disposed on the surface of the first member 141 and may vertically move through the column-shaped powder 144. The column-shaped powder 144 may support the second member 142.

Powder 143a in the region corresponding to the first component 121, of the powder 143 disposed on the surface of the first member 141, may include fluid. The fluid included in the powder 143a may change from a liquid state to a gaseous state by absorbing heat from the first component 121. Powder 143b in the region that does not correspond to the first component 121, of the powder 143 disposed on the surface of the first member 141, may also include fluid. The fluid included in the powder 143b may change from a liquid state to a gaseous state by absorbing heat from the first component 121 while moving toward the powder 143a.

Unlike in the above-described embodiment, powder 144a in the region corresponding to the first component 121, of the column-shaped powder 144 disposed on the surface of the first member 141, may include fluid. The fluid included in the powder 144a may change from a liquid state to a gaseous state by absorbing heat from the first component 121 while moving in the direction from the first member 141 to the second member 142. Powder 144b in the region that does not correspond to the first component 121, of the column-shaped powder 144 disposed on the surface of the first member 141, may also include fluid. The fluid included in the powder 143b may move toward the powder 144b.

The fluid having changed into the gaseous state in the powder 143a and/or the powder 144a may change again from the gaseous state to a liquid state in a region 146 where the first component 121 does not exist. The fluid may discharge the absorbed heat through the second member 142 while changing from the gaseous state to a liquid state. The fluid having changed into the liquid state may be introduced into the powder 143 and 144 again and may change from the liquid state to a gaseous state by absorbing heat in the powder 143a and/or the powder 144a. While FIG. 2A illustrates that the fluid discharges heat absorbed from the first component 121, the fluid may discharge heat absorbed from the second component 122, or may simultaneously discharge heat absorbed from the first component 121 and the second component 122.

Referring to FIG. 2B, the powder 143a may be disposed on a surface of the first member 141, and the powder 145 may be disposed on a surface of the second member 142. The process in which fluid included in the powder 143a changes from a liquid state to a gaseous state by absorbing heat may be substantially the same as the process described above with reference to FIG. 2A. The fluid having changed into the gaseous state may move into the powder 145 disposed on the surface of the second member 142 to change into a liquid state again. For example, the fluid having changed into the gaseous state may make contact with the powder 145 disposed on the surface of the second member 142 to change into a liquid state. The fluid having changed into the liquid state may discharge the heat through the second member 142 and may move into the powder 143a, which is disposed on the surface of the first member 141, through the powder 145 again. The fluid having moved into the powder 143a disposed on the surface of the first member 141 may absorb heat from the first component 121 or the second component 122 to repeat the above-described process.

According to an example embodiment of the present disclosure, the chamber 140 having fluid therein for absorbing heat radiating from components may be disposed inside the electronic device 100 to efficiently discharge the heat radiating from the components outside the electronic device 100.

Figure 3:
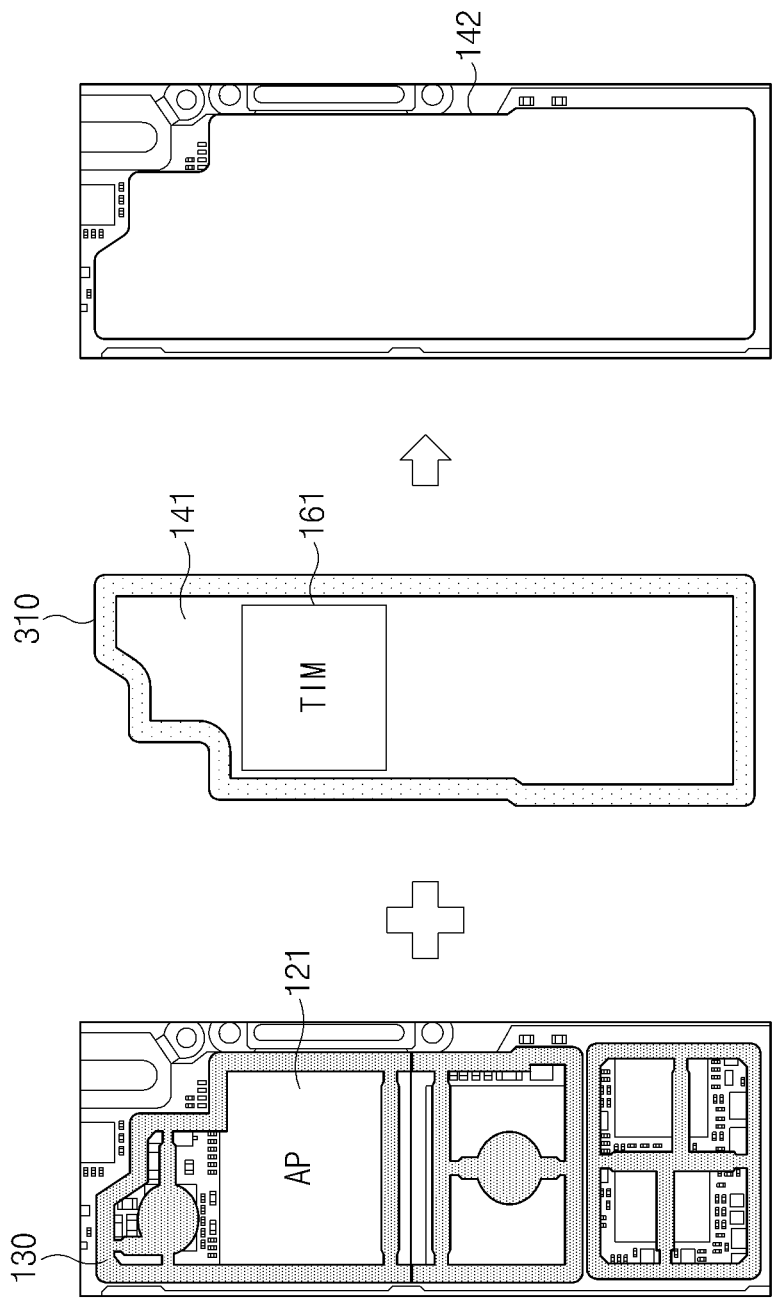
FIG. 3 is a diagram illustrating an example process of sticking a frame and a chamber with a conductive tape or conductive foam, according to an example embodiment.

FIG. 3 is a diagram illustrating an example process of sticking (e.g., adhering, attaching, etc.) the frame 130 and the chamber 140 with a conductive tape or conductive foam, according to an example embodiment.

Referring to FIG. 3, an electronic component may be disposed between the frame 130 and the first member 141 (or a lower part of the chamber 140), and the electronic device 100 may, for example, and without limitation, further include a conductive adhesive layer 310 for sticking (e.g., adhering, attaching, etc.) the frame 130 and the first member 141. Any material capable of sticking the frame 130 and the first member 141 may be used as the conductive adhesive layer 310, and the conductive adhesive layer 310 may be, for example, a conductive tape or conductive foam. The sequence of sticking the frame 130 and the first member 141 is as follows: the conductive adhesive layer 310 may be attached to the frame 130, and then the first member 141 may be coupled to the frame 130. In another embodiment, the conductive adhesive layer 310 may be attached in the form of the frame 130 to the first member 141, and then the first member 141 may be coupled to the frame 130. If the first member 141 is stuck to the frame 130, the second member 142 (an upper part of the chamber 140) and the PCB 110 may face the same direction, as illustrated in FIG. 3.

Unlike in the embodiment illustrated in FIG. 3, the frame 130 and the chamber 140 may be integrated with each other and may be mounted on the PCB 110. For example, the components 121 and 122 may be mounted on the PCB 110, and the integrated chamber may be disposed on the PCB 110 to cover the components 121 and 122 and the thermal interface materials (TIM) 161 and 162.

Figure 4:
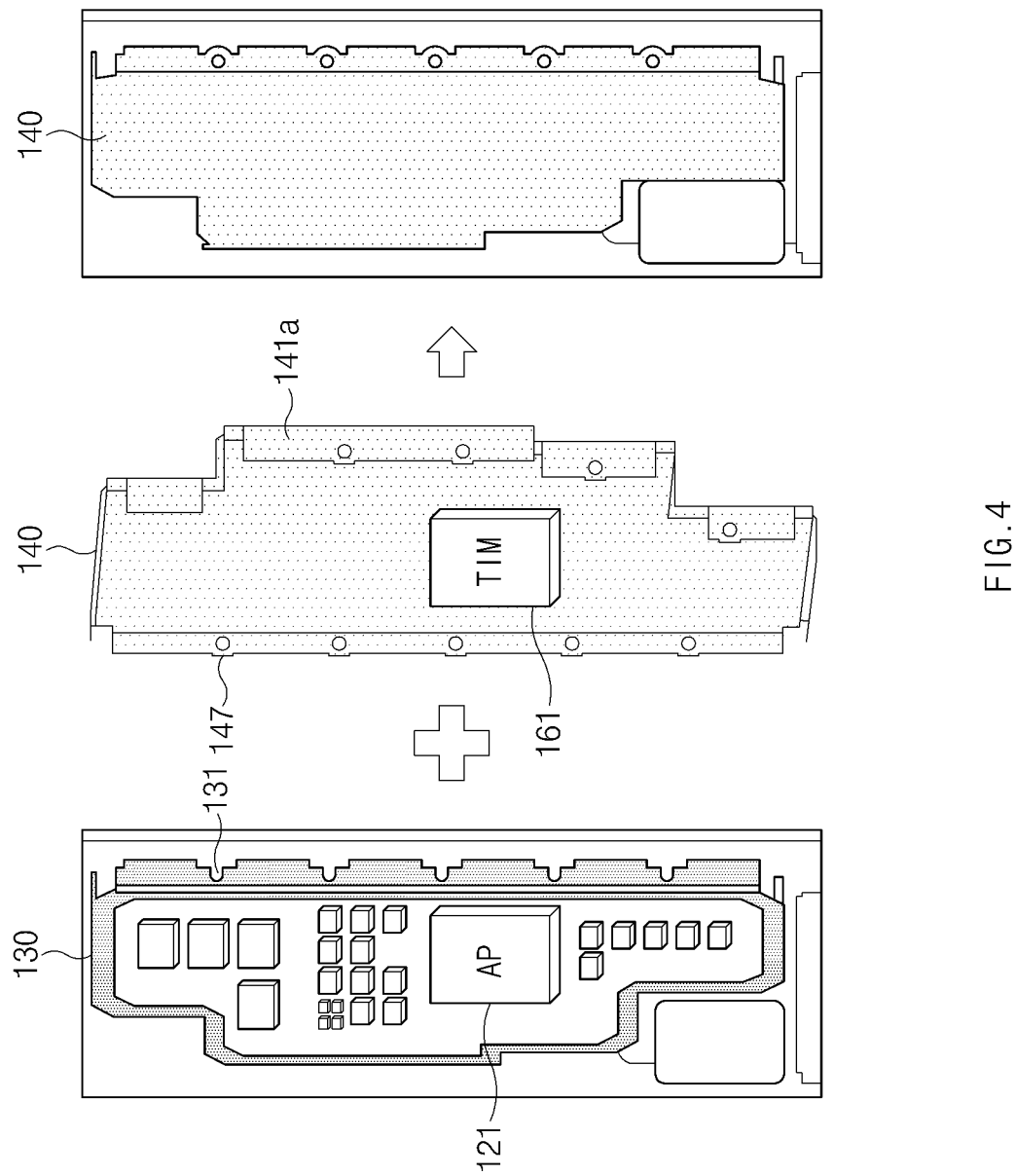
FIG. 4 is a diagram illustrating an example process in which embos of a chamber are coupled to holes of a frame, according to an example embodiment.

FIG. 4 is a diagram illustrating an example process in which embos 147 of the chamber 140 are coupled to holes 131 of the frame 130, according to an example embodiment.

Referring to FIG. 4, the frame 130 including the plurality of holes 131 may be disposed on the PCB 110. For example, the frame 130 including the plurality of holes 131 may be mounted on the PCB 110. If the frame 130 is disposed on the PCB 110, the chamber 140 including the plurality of embos 147 (projections 147) in regions corresponding to the plurality of holes 131 may be coupled to the frame 130. The embos 147 may be a layer comprising a bumpy pattern. For example, unlike the first member 141 illustrated in FIG. 2, the first member 141 illustrated in FIG. 4 may include a side face 141a to surround the frame 130, and the embos 147 may be disposed on the side face 141a.

When the chamber 140 is coupled to the frame 130, the embos 147 may be bent in the direction toward the frame 130. If the bent region of each embo 147 is inserted into each hole 131, the frame 130 and the chamber 140 may be coupled together. The shape of the hole 131 may be the same as, or different from, the shape of the embo 147. The hole 131 may be larger in size than the embo 147 to allow the bent region of the embo 147 to be inserted into the hole 131. According to an embodiment of the present disclosure, the chamber 140 may be easily coupled onto the PCB 110 by inserting the plurality of embos 147 into the plurality of holes 131.

Figure 5:
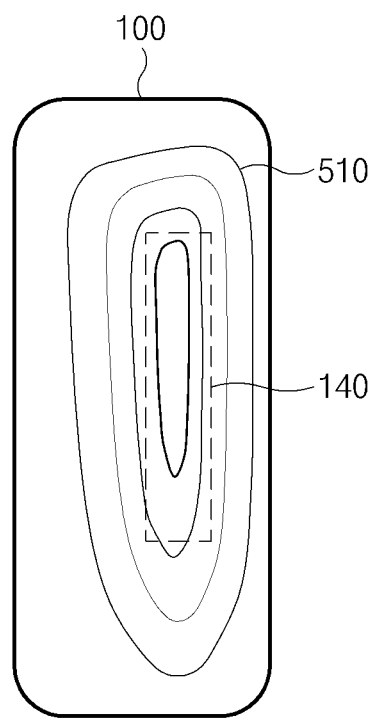
FIG. 5 is a diagram illustrating an example state in which heat radiating from a component is spread by a chamber, according to an example embodiment.

FIG. 5 is a diagram illustrating an example state in which heat radiating from a component is spread by the chamber 140, according to an example embodiment.

Referring to FIG. 5, the chamber 140 may spread heat radiating from the components 121 and 122. The components may be the first and second components 121 and 122 illustrated in FIG. 2. The spread of the heat radiating from the components 121 and 122 may reduce degradation in the performance of other components due to heat radiation. For example, the chamber 140 may spread heat radiating from the first component 121 over a region 510 larger in size than the chamber 140. If the heat radiating from the first component 121 is spread by the chamber 140, heat applied from the first component 121 to a component near the first component 121 may be reduced. According to an embodiment of the present disclosure, by reducing heat applied to other components, it is possible to reduce degradation in the performance of the other components due to heat radiation. Furthermore, if the heat radiating from the components 121 and 122 is spread, it is possible to prevent and/or reduce heat from being intensively generated in a region of the electronic device 100. For example, heat radiating from the first component 121 may be discharged to the display 180 through the bracket 150. If heat is intensively generated in a region of the display 180, a user may stop using the electronic device 100. However, according to an embodiment of the present disclosure, by spreading heat radiating from the first component 121, it is possible to prevent and/or reduce heat from being intensively generated in a region of the electronic device 100. While FIG. 5 illustrates that the chamber 140 spreads heat radiating from the first and second components 121 and 122, the chamber 140 may spread heat radiating from components other than the first and second components 121 and 122.

Figure 6A:
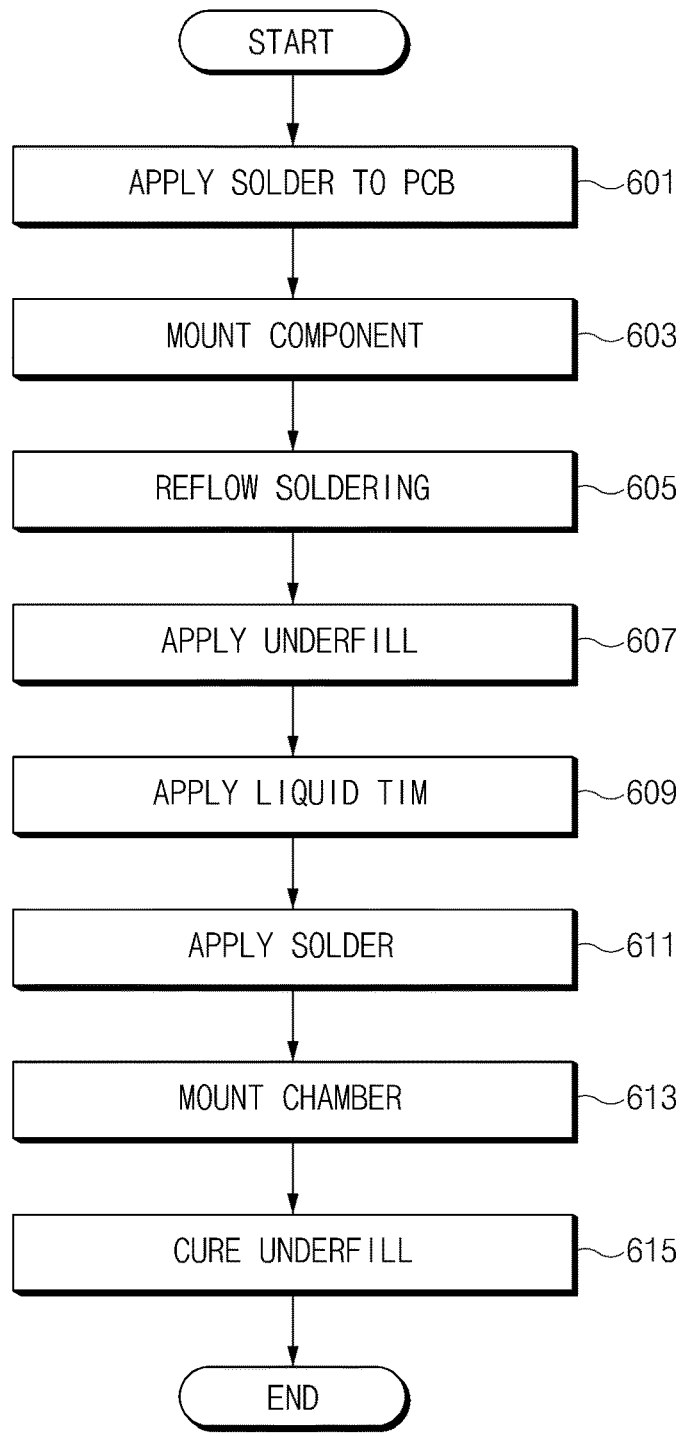
FIG. 6A is a flowchart illustrating an example process of mounting a chamber on a PCB, according to an example embodiment.
Figure 6B:
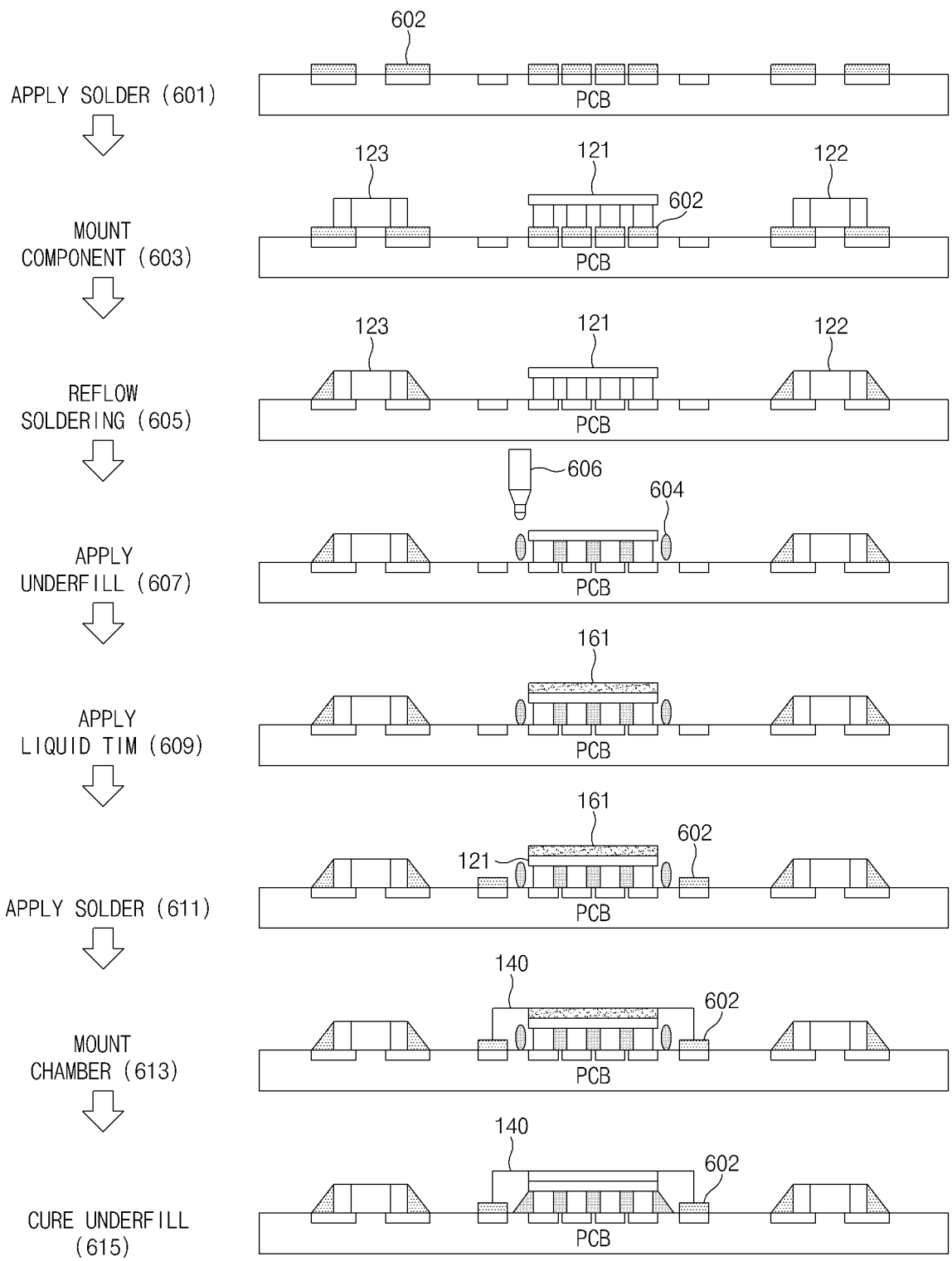
FIG. 6B is a diagram illustrating an example sequence in which a chamber is mounted on a PCB, according to an example embodiment.

FIG. 6A is a flowchart illustrating an example process of mounting the chamber 140 on the PCB 110, according to an example embodiment. FIG. 6B is a diagram illustrating an example sequence in which the chamber 140 is mounted on the PCB 110, according to an example embodiment.

Referring to FIGS. 6A and 6B, in operation 601, solder 602 may be applied to the PCB 110. For example, the solder 602 may be applied in a shape corresponding to components 121, 122, and 123 to electrically connect pins of the components 121, 122, and 123 and the PCB 110. If the solder 602 is applied, in operation 603, the components 121, 122, and 123 may be disposed (mounted) on the solder 602. The components 121, 122, and 123 may, for example, and without limitation, correspond to a PMIC, an AP, a memory, or a CP. If the components 121, 122, and 123 are disposed on the solder 602, in operation 605, the solder 602 may be melted by heat applied thereto. The soldering method illustrated in operation 605 may be, for example, a reflow soldering method.

In operation 607, an under-fill resin material 604 may be applied around the component 121 by an under-fill applicator 606. If the under-fill resin material 604 is applied around the component 121 (e.g., an AP), the under-fill resin material 604 may infiltrate between solder balls below the component 121 to prevent and/or reduce solder cracks. After the under-fill resin material 604 is applied around the component 121, in operation 609, the thermal interface material 161 in a liquid state may be applied onto the component 121. The thermal interface material 161 in a liquid state may be pressed by the weight of the chamber 140 in the case where the chamber 140 is mounted on the component 121.

If the thermal interface material 161 is applied, in operation 611, the solder 602 may be applied close to the component 121. If the solder 602 is applied, in operation 613, the chamber 140 may be disposed (mounted) on the thermal interface material 161. The chamber 140 may include the frame 130 illustrated in FIG. 1. If the chamber 140 is disposed on the thermal interface material 161, in operation 615, heat may be applied to the under-fill resin material 604, and the under-fill resin material 604 having changed into a liquid state may be cured. According to an embodiment of the present disclosure, the chamber 140 may be mounted on the PCB 110 without a separate operation of mounting the frame 130. As a result, it is possible to reduce the time and the number of components required to mount the chamber 140 on the PCB 110.

Figure 7:
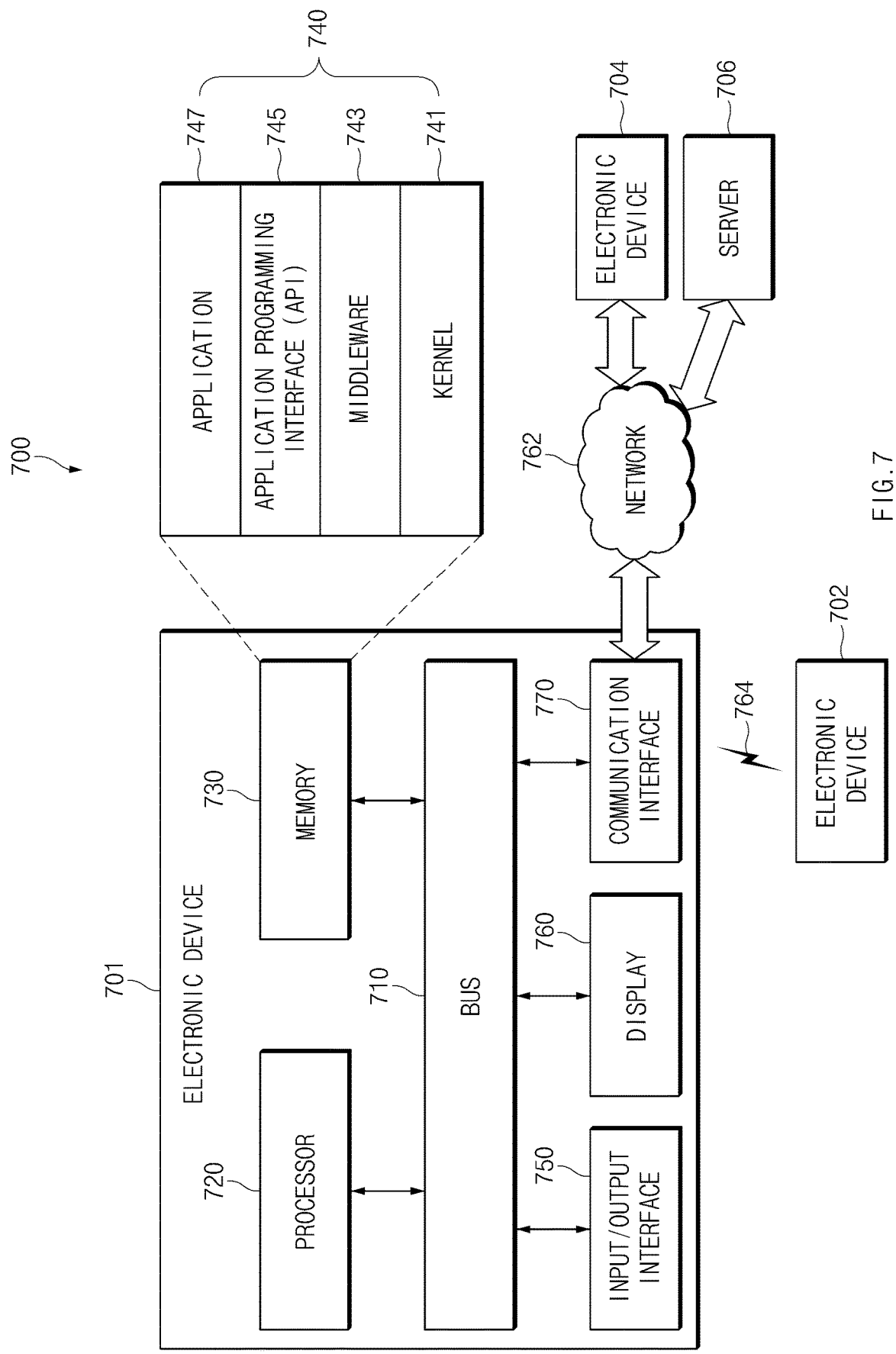
FIG. 7 is a diagram illustrating an example electronic device in a network environment, according to an example embodiment.

FIG. 7 is a diagram illustrating an example electronic device 701 in a network environment 700, according to an example embodiment.

Referring to FIG. 7, according to an embodiment, an electronic device 701, a first electronic device 702, a second electronic device 704, and/or a server 706 may be connected with each other over a network 762 or local wireless communication 764. The electronic device 701 may include a bus 710, a processor (e.g., including processing circuitry)

720, a memory 730, an input/output interface (e.g., including input/output circuitry) 750, a display 760, and a communication interface (e.g., including communication circuitry) 770. According to an embodiment, the electronic device 701 may not include at least one of the above-described elements or may further include other element(s).

For example, the bus 710 may interconnect the above-described elements 710 to 770 and may include a circuit for conveying communications (e.g., a control message and/or data) among the above-described elements.

The processor 720 may include various processing circuitry, such as, for example, and without limitation, one or more of a dedicated processor, a central processing unit (CPU), an application processor (AP), a communication processor (CP), or the like. For example, the processor 720 may perform an arithmetic operation or data processing associated with control and/or communication of at least other elements of the electronic device 701.

The memory 730 may include a volatile and/or nonvolatile memory. For example, the memory 730 may store instructions or data associated with at least one other element(s) of the electronic device 701. According to an embodiment, the memory 730 may store software and/or a program 740. The program 740 may include, for example, a kernel 741, a middleware 743, an application programming interface (API) 745, and/or an application program (or "an application") 747. At least a part of the kernel 741, the middleware 743, or the API 745 may be referred to as an "operating system (OS)".

For example, the kernel 741 may control or manage system resources (e.g., the bus 710, the processor 720, the memory 730, and the like) that are used to execute operations or functions of other programs (e.g., the middleware 743, the API 745, and the application program 747). Furthermore, the kernel 741 may provide an interface that allows the middleware 743, the API 745, or the application program 747 to access discrete elements of the electronic device 701 so as to control or manage system resources.

The middleware 743 may perform, for example, a mediation role such that the API 745 or the application program 747 communicates with the kernel 741 to exchange data.

Furthermore, the middleware 743 may process one or more task requests received from the application program 747 according to a priority. For example, the middleware 743 may assign the priority, which makes it possible to use a system resource (e.g., the bus 710, the processor 720, the memory 730, or the like) of the electronic device 701, to at least one of the application program 747. For example, the middleware 743 may process the one or more task requests according to the priority assigned to the at least one, which makes it possible to perform scheduling or load balancing on the one or more task requests.

The API 745 may be, for example, an interface through which the application program 747 controls a function provided by the kernel 741 or the middleware 743, and may include, for example, at least one interface or function (e.g., an instruction) for a file control, a window control, image processing, a character control, or the like.

The input/output interface 750 may include various input/output circuitry and play a role, for example, an interface which transmits an instruction or data input from a user or another external device, to other element(s) of the electronic device 701. Furthermore, the input/output interface 750 may output an instruction or data, received from other element(s) of the electronic device 701, to a user or another external device.

The display 760 may include, for example, a liquid crystal display (LCD), a light-emitting diode (LED) display, an organic LED (OLED) display, a microelectromechanical systems (MEMS) display, or an electronic paper display, or the like, but is not limited thereto. The display 760 may display, for example, various contents (e.g., a text, an image, a video, an icon, a symbol, and the like) to a user. The display 760 may include a touch screen and may receive, for example, a touch, gesture, proximity, or hovering input using an electronic pen or a part of a user's body.

The communication interface 770 may include various communication circuitry and establish communication between the electronic device 701 and an external device (e.g., the first electronic device 702, the second electronic device 704, or the server 706). For example, the communication interface 770 may be connected to the network 762 over wireless communication or wired communication to communicate with the external device (e.g., the second electronic device 704 or the server 706).

The wireless communication may use at least one of, for example, long-term evolution (LTE), LTE Advanced (LTE-A), Code Division Multiple Access (CDMA), Wideband CDMA (WCDMA), Universal Mobile Telecommunications System (UMTS), Wireless Broadband (WiBro), Global System for Mobile Communications (GSM), or the like, as cellular communication protocol. Furthermore, the wireless communication may include, for example, the local wireless communication 764. The local wireless communication 764 may include at least one of wireless fidelity (Wi-Fi), Bluetooth, near field communication (NFC), magnetic stripe transmission (MST), a global navigation satellite system (GNSS), or the like.

The MST may generate a pulse in response to transmission data using an electromagnetic signal, and the pulse may generate a magnetic field signal. The electronic device 701 may transfer the magnetic field signal to point of sale (POS), and the POS may detect the magnetic field signal using a MST reader. The POS may recover the data by converting the detected magnetic field signal to an electrical signal.

The GNSS may include at least one of, for example, a global positioning system (GPS), a global navigation satellite system (Glonass), a Beidou navigation satellite system (hereinafter referred to as "Beidou"), or an European global satellite-based navigation system (hereinafter referred to as "Galileo") based on an available region, a bandwidth, or the like. Hereinafter, in this disclosure, "GPS" and "GNSS" may be interchangeably used. The wired communication may include at least one of, for example, a universal serial bus (USB), a high definition multimedia interface (HDMI), a recommended standard-232 (RS-232), a plain old telephone service (POTS), or the like. The network 762 may include at least one of telecommunications networks, for example, a computer network (e.g., LAN or WAN), an Internet, or a telephone network.

Each of the first and second electronic devices 702 and 704 may be a device of which the type is different from or the same as that of the electronic device 701. According to an embodiment, the server 706 may include a group of one or more servers. According to an embodiment, all or a portion of operations that the electronic device 701 will perform may be executed by another or plural electronic devices (e.g., the first electronic device 702, the second electronic device 704 or the server 706). According to an embodiment, in the case where the electronic device 701 executes any function or service automatically or in response to a request, the electronic device 701 may not perform the function or the service internally, but, alternatively additionally, it may request at least a portion of a function associated with the electronic device 701 at other electronic device (e.g., the electronic device 702 or 704 or the server 706). The other electronic device may execute the requested function or additional function and may transmit the execution result to the electronic device 701. The electronic device 701 may provide the requested function or service using the received result or may additionally process the received result to provide the requested function or service. To this end, for example, cloud computing, distributed computing, or client-server computing may be used.

Figure 8:
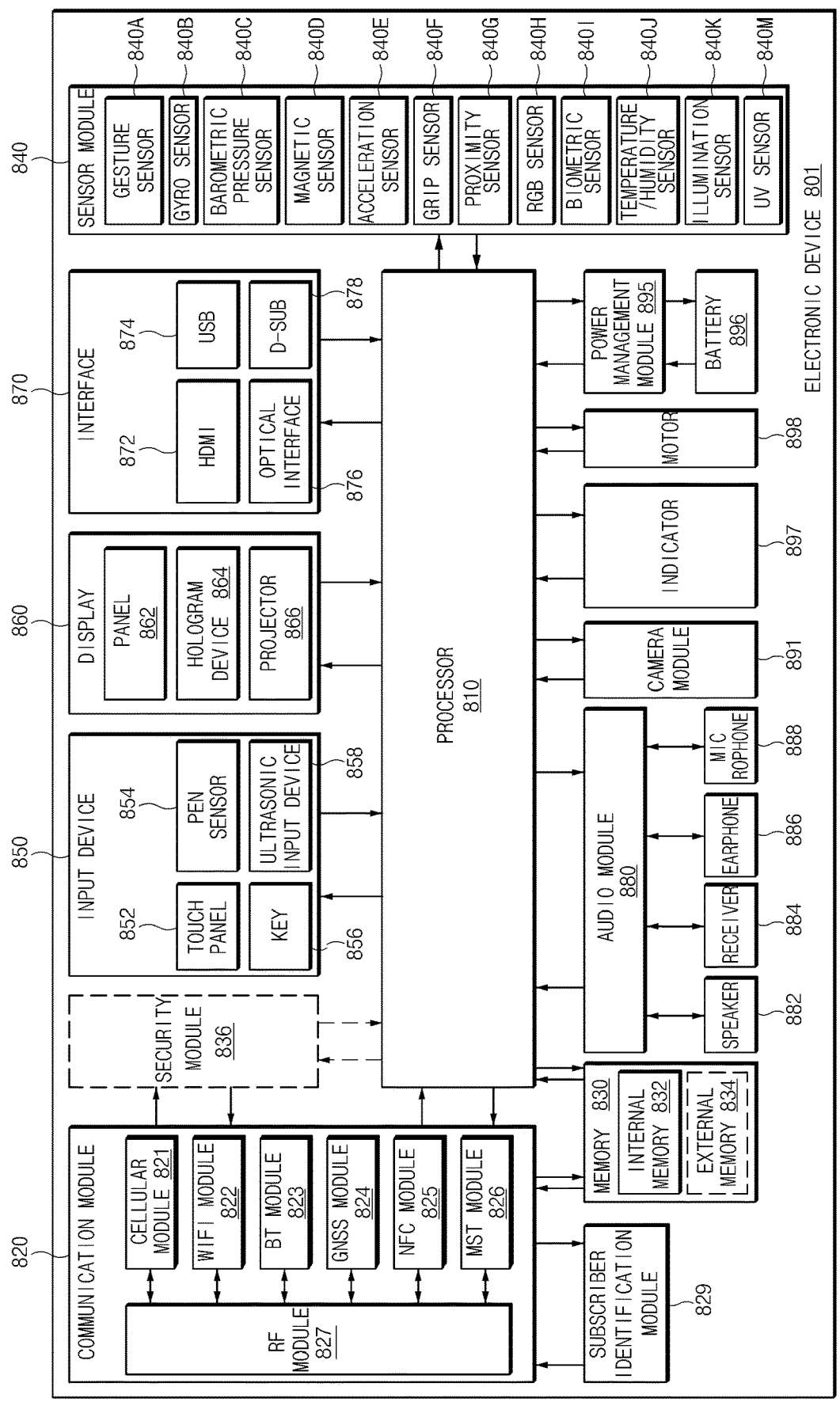
FIG. 8 is a block diagram illustrating an example electronic device, according to an example embodiment.

FIG. 8 is a block diagram illustrating an example electronic device, according to an example embodiment.

Referring to FIG. 8, an electronic device 801 may include, for example, all or a part of the electronic device 701 illustrated in FIG. 7. The electronic device 801 may include one or more processors (e.g., an application processor (AP)) (e.g., including processing circuitry) 810, a communication module (e.g., including communication circuitry) 820, a subscriber identification module 829, a memory 830, a security module (e.g., including security circuitry) 836, a sensor module 840, an input device (e.g., including input circuitry) 850, a display 860, an interface (e.g., including interface circuitry) 870, an audio module 880, a camera module 891, a power management module 895, a battery 896, an indicator 897, and a motor 898.

The processor 810 may include various processing circuitry and drive, for example, an operating system (OS) or an application to control a plurality of hardware or software elements connected to the processor 810 and may process and compute a variety of data. For example, the processor 810 may be implemented with a System on Chip (SoC). According to an embodiment, the processor 810 may further include a graphic processing unit (GPU) and/or an image signal processor. The processor 810 may include at least a part (e.g., a cellular module 821) of elements illustrated in FIG. 8. The processor 810 may load an instruction or data, which is received from at least one of other elements (e.g., a nonvolatile memory), into a volatile memory and process the loaded instruction or data. The processor 810 may store a variety of data in the nonvolatile memory.

The communication module 820 may be configured the same as or similar to the communication interface 770 of FIG. 7. The communication module 820 may include various communication circuitry, such as, for example, and without limitation, one or more of the cellular module 821, a Wi-Fi module 822, a Bluetooth (BT) module 823, a GNSS module 824 (e.g., a GPS module, a Glonass module, a Beidou module, or a Galileo module), a near field communication (NFC) module 825, a MST module 826 and a radio frequency (RF) module 827.

The cellular module 821 may provide, for example, voice communication, video communication, a character service, an Internet service, or the like over a communication network. According to an embodiment, the cellular module 821 may perform discrimination and authentication of the electronic device 801 within a communication network by using the subscriber identification module (e.g., a SIM card) 829. According to an embodiment, the cellular module 821 may perform at least a portion of functions that the processor 810 provides. According to an embodiment, the cellular module 821 may include a communication processor (CP).

Each of the Wi-Fi module 822, the BT module 823, the GNSS module 824, the NFC module 825, or the MST module 826 may include a processor for processing data exchanged through a corresponding module, for example. According to an embodiment, at least a part (e.g., two or more) of the cellular module 821, the Wi-Fi module 822, the BT module 823, the GNSS module 824, the NFC module 825, or the MST module 826 may be included within one Integrated Circuit (IC) or an IC package.

For example, the RF module 827 may transmit and receive a communication signal (e.g., an RF signal). For example, the RF module 827 may include a transceiver, a power amplifier module (PAM), a frequency filter, a low noise amplifier (LNA), an antenna, or the like. According to another embodiment, at least one of the cellular module 821, the Wi-Fi module 822, the BT module 823, the GNSS module 824, the NFC module 825, or the MST module 826 may transmit and receive an RF signal through a separate RF module.

The subscriber identification module 829 may include, for example, a card and/or embedded SIM that includes a subscriber identification module and may include unique identity information (e.g., integrated circuit card identifier (ICCID)) or subscriber information (e.g., international mobile subscriber identity (IMSI)).

The memory 830 (e.g., the memory 730) may include an internal memory 832 and/or an external memory 834. For example, the internal memory 832 may include at least one of a volatile memory (e.g., a dynamic random access memory (DRAM), a static RAM (SRAM), a synchronous DRAM (SDRAM), or the like), a nonvolatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash memory or a NOR flash memory), or the like), a hard drive, or a solid state drive (SSD).

The external memory 834 may further include a flash drive such as compact flash (CF), secure digital (SD), micro secure digital (Micro-SD), mini secure digital (Mini-SD), extreme digital (xD), a multimedia card (MMC), a memory stick, or the like. The external memory 834 may be operatively and/or physically connected to the electronic device 801 through various interfaces.

A security module 836 may be a module that includes a storage space of which a security level is higher than that of the memory 830 and may be a circuit that guarantees safe data storage and a protected execution environment. The security module 836 may be implemented with a separate circuit and may include a separate processor. For example, the security module 836 may be in a smart chip or a secure digital (SD) card, which is removable, or may include an embedded secure element (eSE) embedded in a fixed chip of the electronic device 801. Furthermore, the security module 836 may operate based on an operating system (OS) that is different from the OS of the electronic device 801. For example, the security module 836 may operate based on java card open platform (JCOP) OS.

The sensor module 840 may measure, for example, a physical quantity or may detect an operation state of the electronic device 801. The sensor module 840 may convert the measured or detected information to an electrical signal. For example, the sensor module 840 may include at least one of a gesture sensor 840A, a gyro sensor 840B, a barometric pressure sensor 840C, a magnetic sensor 840D, an acceleration sensor 840E, a grip sensor 840F, the proximity sensor 840G, a color sensor 840H (e.g., red, green, blue (RGB) sensor), a biometric sensor 840I, a temperature/humidity sensor 840J, an illumination sensor 840K, or an UV sensor 840M. Although not illustrated, additionally or generally, the sensor module 840 may further include, for example, an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 840 may further include a control circuit for controlling at least one or more sensors included therein. According to an embodiment, the electronic device 801 may further include a processor that is a part of the processor 810 or independent of the processor 810 and is configured to control the sensor module 840. The processor may control the sensor module 840 while the processor 810 remains at a sleep state.

The input device 850 may include various input circuitry, such as, for example, and without limitation, at least one of a touch panel 852, a (digital) pen sensor 854, a key 856, or an ultrasonic input unit 858. For example, the touch panel 852 may use at least one of capacitive, resistive, infrared and ultrasonic detecting methods. Also, the touch panel 852 may further include a control circuit. The touch panel 852 may further include a tactile layer to provide a tactile reaction to a user.

The (digital) pen sensor 854 may be, for example, a part of a touch panel or may include an additional sheet for recognition. The key 856 may include, for example, a physical button, an optical key, or a keypad. The ultrasonic input device 858 may detect (or sense) an ultrasonic signal, which is generated from an input device, through a microphone (e.g., a microphone 888) and may check data corresponding to the detected ultrasonic signal.

The display 860 (e.g., the display 760) may include a panel 862, a hologram device 864, or a projector 866. The panel 862 may be the same as or similar to the display 760 illustrated in FIG. 7. The panel 862 may be implemented, for example, to be flexible, transparent or wearable. The panel 862 and the touch panel 852 may be integrated into a single module. The hologram device 864 may display a stereoscopic image in a space using a light interference phenomenon. The projector 866 may project light onto a screen so as to display an image. For example, the screen may be arranged in the inside or the outside of the electronic device 801. According to an embodiment, the display 860 may further include a control circuit for controlling the panel 862, the hologram device 864, or the projector 866.

The interface 870 may include various interface circuitry, such as, for example, and without limitation, one or more of a high-definition multimedia interface (HDMI) 872, a universal serial bus (USB) 874, an optical interface 876, or a D-subminiature (D-sub) 878. The interface 870 may be included, for example, in the communication interface 770 illustrated in FIG. 7. Additionally or generally, the interface 870 may include, for example, a mobile high definition link (MHL) interface, a SD card/multi-media card (MMC) interface, or an infrared data association (IrDA) standard interface.

The audio module 880 may convert a sound and an electric signal in dual directions. At least a part of the audio module 880 may be included, for example, in the input/output interface 750 illustrated in FIG. 7. The audio module 880 may process, for example, sound information that is input or output through a speaker 882, a receiver 884, an earphone 886, or the microphone 888.

For example, the camera module 891 may shoot a still image or a video. According to an embodiment, the camera module 891 may include at least one or more image sensors (e.g., a front sensor or a rear sensor), a lens, an image signal processor (ISP), or a flash (e.g., an LED or a xenon lamp).

The power management module 895 may manage, for example, power of the electronic device 801. According to an embodiment, a power management integrated circuit (PMIC), a charger IC, or a battery or fuel gauge may be included in the power management module 895. The PMIC may have a wired charging method and/or a wireless charging method. The wireless charging method may include, for example, a magnetic resonance method, a magnetic induction method or an electromagnetic method and may further include an additional circuit, for example, a coil loop, a resonant circuit, a rectifier, or the like. The battery gauge may measure, for example, a remaining capacity of the battery 896 and a voltage, current or temperature thereof while the battery is charged. The battery 896 may include, for example, a rechargeable battery and/or a solar battery.

The indicator 897 may display a specific state of the electronic device 801 or a part thereof (e.g., the processor 810), such as a booting state, a message state, a charging state, and the like. The motor 898 may convert an electrical signal into a mechanical vibration and may generate the following effects: vibration, haptic, and the like. Although not illustrated, a processing device (e.g., a GPU) for supporting a mobile TV may be included in the electronic device 801. The processing device for supporting the mobile TV may process media data according to the standards of digital multimedia broadcasting (DMB), digital video broadcasting (DVB), MediaFLO™, or the like.

Each of the above-mentioned elements of the electronic device according to various embodiments of the present disclosure may be configured with one or more components, and the names of the elements may be changed according to the type of the electronic device. In an embodiment, the electronic device may include at least one of the above-mentioned elements, and some elements may be omitted or other additional elements may be added. Furthermore, some of the elements of the electronic device according to an embodiment may be combined with each other so as to form one entity, so that the functions of the elements may be performed in the same manner as before the combination.

Figure 9:
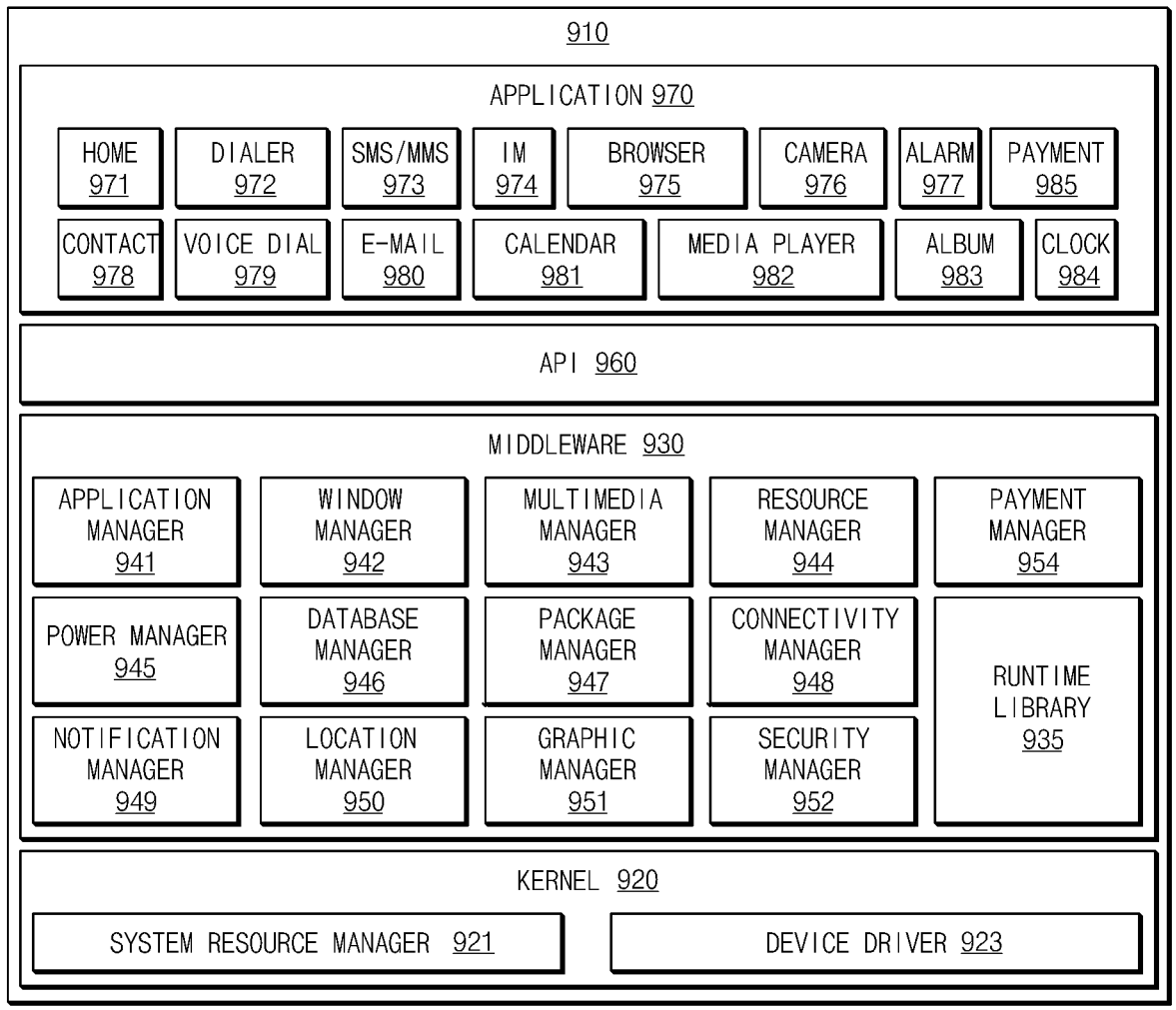
FIG. 9 is a block diagram illustrating an example program module, according to an example embodiment.

FIG. 9 is a block diagram illustrating an example program module, according to various example embodiments.

According to an embodiment, a program module 910 (e.g., the program 740) may include an operating system (OS) to control resources associated with an electronic device (e.g., the electronic device 701), and/or diverse applications (e.g., the application program 747) driven on the OS. The OS may be, for example, Android, iOS, Windows, Symbian, or Tizen.

The program module 910 may include a kernel 920, a middleware 930, an application programming interface (API) 960, and/or an application 970. At least a portion of the program module 910 may be preloaded on an electronic device or may be downloadable from an external electronic device (e.g., the first electronic device 702, the second electronic device 704, the server 706, or the like).

The kernel 920 (e.g., the kernel 741) may include, for example, a system resource manager 921 and/or a device driver 923. The system resource manager 921 may control, allocate, or retrieve system resources. According to an embodiment, the system resource manager 921 may include a process managing unit, a memory managing unit, a file system managing unit, or the like. The device driver 923 may include, for example, a display driver, a camera driver, a Bluetooth driver, a shared memory driver, a USB driver, a keypad driver, a Wi-Fi driver, an audio driver, or an inter-process communication (IPC) driver.

The middleware 930 may provide, for example, a function that the application 970 needs in common, or may provide diverse functions to the application 970 through the API 960 to allow the application 970 to efficiently use limited system resources of the electronic device. According to an embodiment, the middleware 930 (e.g., the middleware 743) may include at least one of a runtime library 935, an application manager 941, a window manager 942, a multimedia manager 943, a resource manager 944, a power manager 945, a database manager 946, a package manager 947, a connectivity manager 948, a notification manager 949, a location manager 950, a graphic manager 951, a security manager 952, and/or a payment manager 954.

The runtime library 935 may include, for example, a library module that is used by a compiler to add a new function through a programming language while the application 970 is being executed. The runtime library 935 may perform input/output management, memory management, or capacities about arithmetic functions.

The application manager 941 may manage, for example, a life cycle of at least one application of the application 970. The window manager 942 may manage a graphic user interface (GUI) resource that is used in a screen. The multimedia manager 943 may identify a format necessary for playing diverse media files, and may perform encoding or decoding of media files by using a codec suitable for the format. The resource manager 944 may manage resources such as a storage space, memory, or source code of at least one application of the application 970.

The power manager 945 may operate, for example, with a basic input/output system (BIOS) to manage a battery or power, and may provide power information for an operation of an electronic device. The database manager 946 may generate, search for, or modify database that is to be used in at least one application of the application 970. The package manager 947 may install or update an application that is distributed in the form of package file.

The connectivity manager 948 may manage, for example, wireless connection such as Wi-Fi or Bluetooth. The notification manager 949 may display or notify an event such as arrival message, appointment, or proximity notification in a mode that does not disturb a user. The location manager 950 may manage location information about an electronic device. The graphic manager 951 may manage a graphic effect that is provided to a user, or manage a user interface relevant thereto. The security manager 952 may provide a general security function necessary for system security, user authentication, or the like. According to an embodiment, in the case where an electronic device (e.g., the electronic device 701) includes a telephony function, the middleware 930 may further include a telephony manager for managing a voice or video call function of the electronic device.

The middleware 930 may include a middleware module that combines diverse functions of the above-described elements. The middleware 930 may provide a module specialized to each OS kind to provide differentiated functions. Additionally, the middleware 930 may dynamically remove a part of the preexisting elements or may add new elements thereto.

The API 960 (e.g., the API 745) may be, for example, a set of programming functions and may be provided with a configuration that is variable depending on an OS. For example, in the case where an OS is the android or the iOS, it may provide one API set per platform. In the case where an OS is Tizen, it may provide two or more API sets per platform.

The application 970 (e.g., the application program 747) may include, for example, one or more applications capable of providing functions for a home 971, a dialer 972, an SMS/MMS 973, an instant message (IM) 974, a browser 975, a camera 976, an alarm 977, a contact 978, a voice dial 979, an e-mail 980, a calendar 981, a media player 982, an album 983, a clock 984, and/or a payment 985. Additionally, or alternatively, though not shown, the application 970 may include applications related to health care (e.g., measuring an exercise quantity, blood sugar, or the like) or offering of environment information (e.g., information of barometric pressure, humidity, temperature, or the like).

According to an embodiment, the application 970 may include an application (hereinafter referred to as "information exchanging application" for descriptive convenience) to support information exchange between an electronic device (e.g., the electronic device 701) and an external electronic device (e.g., the first electronic device 702 or the second electronic device 704). The information exchanging application may include, for example, a notification relay application for transmitting specific information to an external electronic device, or a device management application for managing the external electronic device.

For example, the notification relay application may include a function of transmitting notification information, which arise from other applications (e.g., applications for SMS/MMS, e-mail, health care, or environmental information), to an external electronic device. Additionally, the notification relay application may receive, for example, notification information from an external electronic device and provide the notification information to a user.

The device management application may manage (e.g., install, delete, or update), for example, at least one function (e.g., turn-on/turn-off of an external electronic device itself (or a part of components) or adjustment of brightness (or resolution) of a display) of the external electronic device which communicates with the electronic device, an application running in the external electronic device, or a service (e.g., a call service, a message service, or the like) provided from the external electronic device.

According to an embodiment, the application 970 may include an application (e.g., a health care application of a mobile medical device) that is assigned in accordance with an attribute of an external electronic device. According to an embodiment, the application 970 may include an application that is received from an external electronic device (e.g., the first electronic device 702, the second electronic device 704, or the server 706). According to an embodiment, the application 970 may include a preloaded application or a third party application that is downloadable from a server. The names of elements of the program module 910 according to the embodiment may be modifiable depending on kinds of operating systems.

According to an embodiment, at least a portion of the program module 910 may be implemented by software, firmware, hardware, or a combination of two or more thereof. At least a portion of the program module 910 may be implemented (e.g., executed), for example, by the processor (e.g., the processor 810). At least a portion of the program module 910 may include, for example, modules, programs, routines, sets of instructions, processes, or the like for performing one or more functions.

The term "module" used in this disclosure may refer, for example, to a unit including one or more combinations of hardware, software and firmware. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, the "module" may include, without limitation, at least one of a dedicated processor, a CPU, an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) according to an embodiment may be, for example, implemented by instructions stored in computer-readable storage media in the form of a program module. The instruction, when executed by a processor (e.g., the processor 720), may cause the one or more processors to perform a function corresponding to the instruction. The computer-readable storage media, for example, may be the memory 730.

A computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), and hardware devices (e.g., a read only memory (ROM), a random access memory (RAM), or a flash memory). Also, a program instruction may include not only a mechanical code such as things generated by a compiler but also a high-level language code executable on a computer using an interpreter. The above hardware unit may be configured to operate via one or more software modules for performing an operation of various embodiments of the present disclosure, and vice versa.

A module or a program module according to various embodiments may include at least one of the above elements, or a part of the above elements may be omitted, or additional other elements may be further included. Operations performed by a module, a program module, or other elements according to various embodiments may be executed sequentially, in parallel, repeatedly, or in a heuristic method. In addition, some operations may be executed in different sequences or may be omitted. Alternatively, other operations may be added.

While the present disclosure has been illustrated and described with reference to various example embodiments thereof, it will be understood by those skilled in the art that various changes in form and details may be made therein without departing from the spirit and scope of the present disclosure as defined by the appended claims and their equivalents.

What is claimed is:

1. An electronic device comprising:
a housing comprising a metal part forming a surface of the electronic device;
a cover glass coupled to the housing, the cover glass together with at least the housing forming an inner space;
a metal bracket positioned in the inner space and connected to the metal part of the housing;
a display disposed between the metal bracket and the cover glass, the display disposed on a first side of the metal bracket;
a printed circuit board (PCB) disposed on a second side of the metal bracket;
a first component disposed on the PCB and a second component disposed on the PCB; and
a chamber comprising a first metal surface disposed on the first component and the second component, and a second metal surface disposed on the metal bracket; wherein the first metal surface includes a first region over and corresponding to the first component, and a second region over and corresponding to the second component, wherein the first and second regions of the chamber are spaced apart from each other,
a column-shaped powder is provided inside the chamber for serving as a passage through fluid, extending from the first metal surface toward the second metal surface; and
wherein the first metal surface, the powder, the second metal surface, the metal bracket, and the metal part of the housing form a heat dissipation path of a heat dissipating from the first component and the second component.

2. The electronic device of claim 1, wherein the column-shaped powder is disposed on a surface of the internal space of the chamber.

3. The electronic device of claim 1, further comprising:
a frame disposed on the PCB, and surrounding the first and second components,
wherein the chamber is disposed on the frame.

4. The electronic device of claim 3, further comprising:
an adhesive layer disposed between the frame and the chamber for adhering the frame and the chamber together.

5. The electronic device of claim 3, wherein the frame includes a plurality of holes,
wherein the chamber includes a plurality of projections in regions corresponding to the plurality of holes, and
wherein the plurality of holes and the plurality of projections are coupled together.

6. The electronic device of claim 1, further comprising:
wherein the chamber is directly coupled with the metal bracket.

7. The electronic device of claim 1, wherein the chamber comprises copper.

8. The electronic device of claim 1, wherein the first component comprises an application processor (AP) and the second component comprises a memory.

9. An electronic device comprising:
a housing comprising a metal part forming a surface of the electronic device;
a cover glass coupled to the housing, the cover glass together with the housing forming an inner space;
a metal bracket positioned in the inner space;
a printed circuit board (PCB) disposed on a second side of the metal bracket;
a first component disposed on the PCB and a second component disposed on the PCB;
a frame disposed on the PCB and surrounding the first and second components;
a chamber comprising a first metal surface disposed on the first component and the second component, and a second metal surface disposed on the metal bracket; wherein the first metal surface includes a first region over and corresponding to the first component, and a second region over and corresponding to the second component, wherein the first and second regions of the chamber are spaced apart from each other;
wherein a portion of the second metal surface extends toward the PCB to surround at least a portion of the frame;
a liquid thermal interface material (TIM) disposed between the first component and the metal surface at the bottom of the chamber, for transferring heat radiated from the first component to the metal surface of the chamber;

a column-shaped powder is provided inside the chamber for serving as a passage through fluid, extending from the first metal surface toward the second metal surface; and wherein the first metal surface, the powder, the second metal surface, the metal bracket, and the metal part of the housing form a heat dissipation path of a heat dissipating from the first component and the second component.

10. The electronic device of claim 9, wherein the column-shaped powder is disposed on a surface of the first metal surface and on a surface of the second metal surface.

11. The electronic device of claim 9, wherein the column-shaped powder is disposed as a plurality of columns on a surface of the first metal surface and supports the second metal surface.

12. The electronic device of claim 9, further comprising: wherein the second metal surface is coupled with the metal bracket.

13. The electronic device of claim 9, wherein the first and second metal surfaces comprise copper.

14. The electronic device of claim 9, further comprising: an adhesive layer disposed between the frame and the first metal surface for adhering the frame and the first metal surface together.

15. The electronic device of claim 9, wherein the frame includes a plurality of holes, wherein the first metal surface includes a plurality of projections in regions corresponding to the plurality of holes, and wherein the plurality of holes and the plurality of projections are coupled together.

16. The electronic device of claim 9, wherein the first component comprises an application processor (AP) and the second component comprises a memory.

* * * * *